United States Patent [19]

Holzapfel et al.

[11] Patent Number: 4,803,649

[45] Date of Patent: Feb. 7, 1989

[54] MODULO-2-ADDER FOR THE LOGIC-LINKING OF THREE INPUT SIGNALS

[75] Inventors: Heinz-Peter Holzapfel, Munich; Karlheinrich Horninger, Eglharting, both of Fed. Rep. of Germany

[73] Assignee: Siemens Aktiengesellschaft, Berlin and Munich, Fed. Rep. of Germany

[21] Appl. No.: 26,736

[22] Filed: Mar. 17, 1987

[30] Foreign Application Priority Data

Mar. 25, 1986 [DE] Fed. Rep. of Germany ....... 3610058

[51] Int. Cl.$^4$ ................................................ G06F 7/50
[52] U.S. Cl. .................................................... 364/784
[58] Field of Search ................................ 364/784–788

[56] References Cited

U.S. PATENT DOCUMENTS

| | | | |
|---|---|---|---|
| 3,906,211 | 9/1975 | Glaser | 364/786 |
| 4,569,032 | 2/1986 | Lee | 364/787 |
| 4,601,007 | 7/1986 | Uya et al. | 364/784 |
| 4,667,303 | 5/1987 | Pfennings | 364/784 |

FOREIGN PATENT DOCUMENTS 0136952  4/1985  European Pat. Off. .
2516674  5/1983  France .

OTHER PUBLICATIONS

Elektronik, vol. 19, Sep. 21, 1984, p. 68, VLSI Design, Feb. 1984, pp. 78–80.

*Primary Examiner*—Gary V. Harkcom
*Assistant Examiner*—Dale M. Shaw
*Attorney, Agent, or Firm*—Hill, Van Santen, Steadman & Simpson

[57] ABSTRACT

Three-value modulo-2-adders consist of four circuit components (SC1, SC2, SC3, SC4) and an analysis circuit (AW). The first circuit component (SC1) generates an intermediate signal corresponding to the first binary value ("1") when two of the input signals (A, B, C) each assume the other binary value ("0"). The second circuit component (SC2) generates an intermediate signal (ZS2) corresponding to the other binary value when two input signals each assume the first binary value. The intermediate value emitted from the output of the third circuit component (SC3) is binary "0" when all three input signals assume the binary value "1". The fourth circuit component (SC4) emits the binary value "1" when all the input signals have the binary value "0". The analysis circuit (AW1) switches through the first or second intermediate signal to the output when the third intermediate signal has the value binary "1" and the fourth intermediate signal has the value binary "0", otherwise the third or fourth intermediate signal is switched through in inverted form to the output.

16 Claims, 6 Drawing Sheets

MODULO-2-ADDER FOR THE LOGIC-LINKING OF THREE INPUT SIGNALS

BACKGROUND OF THE INVENTION

The invention relates to a modulo-2-adder for the logic-linking of three input signals.

Modulo-2-adders are frequently used in the data control of data words where test bits are attached to the data word. The test bits are generated by the binary addition of the data bits. The number of test bits attached to a data word depends upon whether errors are simply to be recognized or also corrected.

In the simplest example the test bits are discovered by the modulo-2-addition of two binary digits. The logic element capable of performing this addition is referred to as a EXCLUSIVE-OR-gate or in brief an EXOR-gate. If more than two data digits are to be binary-added, the adders are connected in the form of a so-called binary tree. An example is shown in FIG. 1 which indicates how eight input signals E1 to E8 are binary-added to form an output signal D. Adders AD1 are arranged at each of the intersection points. For n data bits, thus for n input signals, n-1 adders are required and therefore the binary tree has a depth of m stages, where $2^m = n$. The time required to form the result is calculated from the addition time of a binary adder multiplied by the depth of the binary tree. For example, a test bit generator for eight data bits E1 to E8 requires seven adders AD1 which have formed the result D after three addition times.

If adders capable of adding three input signals or three data bits were used to calculate the test bits, a ternary tree corresponding to FIG. 2 would result. Here for n data bits INT(n/2) adders are required and the ternary tree has a depth of m stages, where $3^m = n$. If, in accordance with FIG. 2, eight data bits or input signals are to be logic-linked, four three-value adders AD2 are required which have formed the result D after two addition times. If only eight of the nine existing inputs shown in FIG. 2 are used, the remaining input can be used to switch-over between even/odd parity formation.

Ternary trees corresponding to FIG. 2 thus have advantages in relation to binary trees are shown in FIG. 1. To permit these advantages to be exploited in practice, the three-value adders must fulfill two conditions: on the one hand their addition time must not be very much longer than that of the two-value adders, and on the other hand the outlay in respect of the transistors—and thus the space requirement on the chip-must not be very much greater than in the binary adders.

SUMMARY OF THE INVENTION

Therefore the aim on which the invention is based is to provide a modulo-2-adder for the logic-linking of three input signals which, in comparison to a modulo-2-adder for two input signals, require only a slightly longer addition time and whose transistor requirement is not very much greater than that of a binary adder, so that the logic-linking of a large number of input signals is more favourable when the three-value adder is used than when two-value adders are used.

This aim is fulfilled in a modulo-2-adder having four circuit components and an analysis circuit. The first circuit component generates an intermediate signal corresponding to one binary value when two of the three input signals each assume the other binary value; the second circuit component generates an intermediate signal corresponding to the other binary value when two input signals each assume a first binary value. The intermediate value emitted from the output of the third circuit component assumes the other binary value when all three input signals are at the first binary value; and the fourth circuit component emits the first binary value when all the input signals have the other binary value. The analysis circuit switches through the first or second intermediate signal to the output when the third intermediate signal has the first binary value and the fourth intermediate signal has the other binary value, and otherwise the third or fourth intermediate signal is switched in inverted form to the output.

The number of switching elements, e.g. n-channel transistors or p-channel transistors, needed to construct the three-value adder is reduced if, in each circuit component, two circuit elements driven in the circuit arms by the same input signal with the same polarity are replaced by a common circuit element. A further advantage of the modulo-2-adder consists in that a full adder can easily be provided. The adders are particularly suitable for CMOS-gate arrays.

BRIEF DESCRIPTION OF THE DRAWINGS

The invention will be explained in further detail making reference to exemplary embodiments which are shown in the Figures.

DESCRIPTION OF THE PREFERRED EMBODIMENTS

Figure 1:
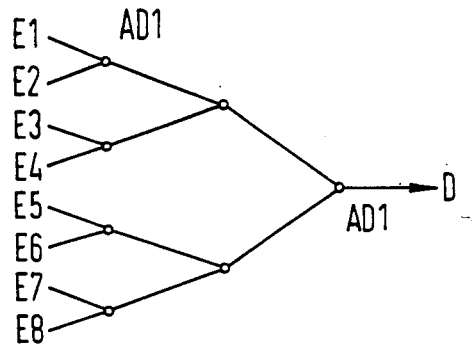
FIG. 1 represents a known binary tree for eight input signals with a depth of three.
Figure 2:
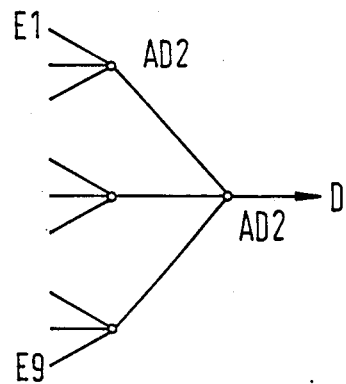
FIG. 2 represents a known ternary tree for nine input signals with a depth of two.

FIGS. 1 and 2 have already been explained in the aforegoing. FIG. 1 is a diagram of the logic-linking of eight input signals E1 to E8 using two-value modulo-2-adders AD1, whereas FIG. 2 is a diagram of the logic-linking of nine input signals E1 to E9 using three-value modulo-2-adders AD2. The binary tree represented in FIG. 1 has a depth of three and requires seven two-value adders AD1. When three-value modulo-2-adders AD2 are used, four adders AD2 are required to logic-link eight input signals and the ternary tree has a depth of two.

The construction of the three-value modulo-2-adders is represented in the following Figures.

Figure 3:
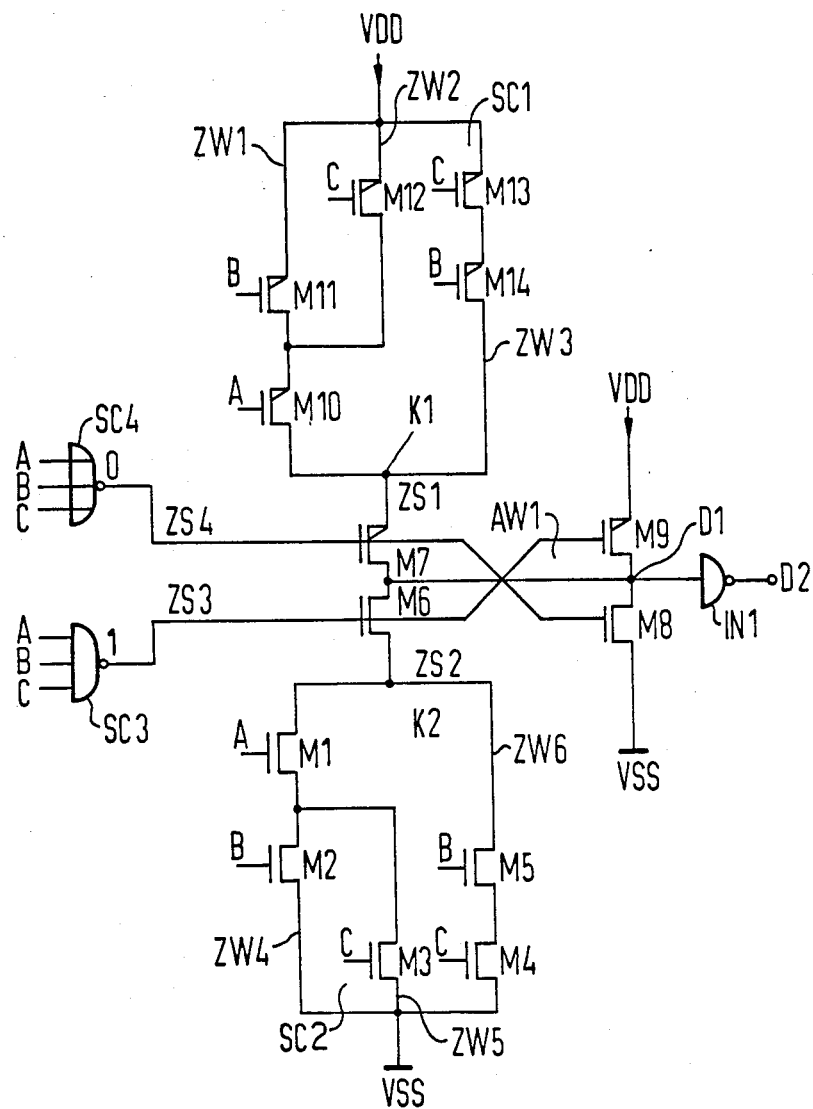
FIG. 3 represents a first exemplary embodiment of a modulo-2-adder for three input signals.

In accordance with FIG. 3, the modulo-2-adders for three input signals A, B, and C consists of four circuit components SC1, SC2, SC3, SC4 and an analysis circuit AW1. The circuit component SC1 consists of three series arrangements of two switching elements which are arranged between a first fixed potential VDD and a node K1. The series arrangements of the switching elements are referenced ZW1, ZW2 and ZW3. The switching elements consist of p-channel transistors as indicated by the symbol used for these transistors, namely M11 and M10 for ZW1, M10 and M12 for ZW2 and M13, M14 for ZW3. In the case of arms ZW1 and ZW2 a common transistor M10 is provided as the same input signal A is to be processed in both arms. The common transistor M10 is adjacent to the node K1. By means of the first circuit component SC1, an intermediate signal ZS1 assigned to the first binary value "1" is applied to the node K1 when two of the binary signals A, B and C each assume the other binary value "0".

The circuit component SC2 is constructed in accordance with the circuit component SC1. It is arranged between a second fixed potential VSS and a node K2 and comprises three series arrangements ZW4, ZW5 and ZW6. The series arrangement ZW4 consists of switching elements M2 and M1, ZW5 of switching elements M3 and M1 and ZW6 of switching elements M4 and M5. The switching elements M1 to M5 represent n-channel transistors, as indicated by the symbol used for these transistors. The series arrangements ZW4 and ZW5 are assigned the common transistor M1 to which the input signal A is supplied, because the same input signal A must be processed in both series arrangements as ZW4 and ZW5. With the assistance of the circuit component SC2, an intermediate signal ZS2 corresponding to the other binary value "0" is applied to the node K2 when at least two of the input signals A, B, and C assume the other binary value "1".

The third circuit component SC3 consists of a NAND-gate which is supplied with the input signals A, B, and C. An intermediate signal ZS3 corresponding to the other binary value "0" is emitted from the output of the third circuit component SC3 when all the input signals A, B, and C assume the first binary value "1".

The fourth circuit component SC4 is constructed from a NOR-circuit which is supplied with the three input signals A, B, and C and which, at the output, generates an intermediate signal ZS4, corresponding to the first binary value "1", when all the input signals A, B, and C assume the other binary value "0".

With the assistance of the analysis circuit AW1, the intermediate signal ZS which represents the logic-linking result of the three input signals A, B, and C is now switched through to the output D1. The analysis circuit AW1 consists of switching elements M7, M6 which are arranged in series between the nodes K1 and K2 and of a series arrangement composed of the switching elements M8, M9 which is arranged between the first fixed potential VDD and the second fixed potential VSS. The switching elements M7 and M9 represent p-channel transistors whereas the switching elements M6 and M8 represent n-channel transistors.

The intermediate signal XS2 is fed via the transistor M6 to the output D1 when the NAND-function of the circuit component SC3 is not fulfilled. The intermediate result ZS1 is fed via the transistor M7 to the output D1 when the NOR-function of the circuit component SC4 is not fulfilled. If the NAND-function of the circuit component SC3 is fulfilled, the transistor M6 is blocked whereas the transistor M9 is conductive. As a result the NAND-intermediate signal ZS3 is applied in inverted form to the output D1. If, on the other hand, the NOR-function of the three input signals is fulfilled, the transistor M7 is blocked and the intermediate signal ZS4 switches the transistor M8 conductive so that the intermediate signal ZS4 occurs in inverted form at the output D1.

With the assistance of the analysis circuit AW1 it is thus ensured that the intermediate signal ZS1 is applied to the output D1 when two input signals have the value binary "0", that the intermediate signal ZS3 is applied to the output D1 when two input signals have the value binary "1" and that the intermediate signals ZS3 and ZS4 are applied in inverted form to the output D1 when all the input signals have the value binary "1" or binary "0".

The inverter component IN1 can be arranged at the output D1 in order to decouple the following switching stages from the modulo-2-adder as shown in FIG. 3.

Figure 4:
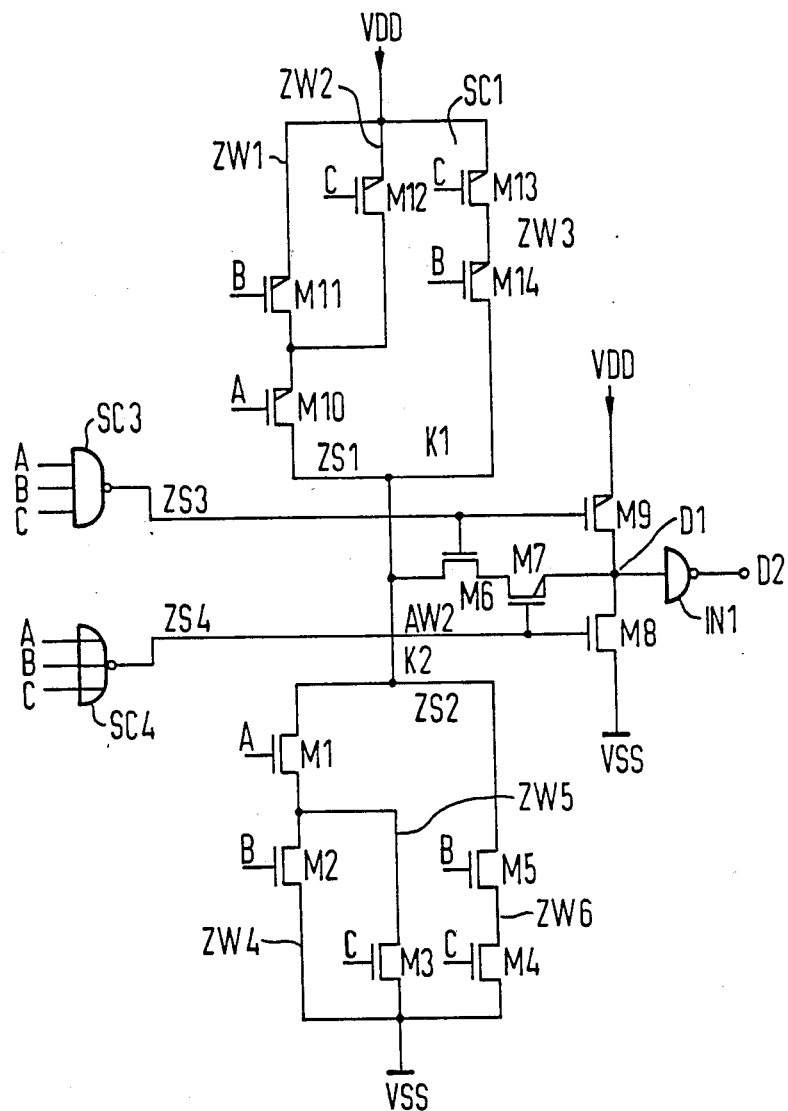
FIG. 4 represents a second exemplary embodiment of a modulo-2-adder for three input signals.

The modulo-2-adder shown in FIG. 4 differs from that shown in FIG. 3 only in as much as the analysis circuit has been modified. The analysis circuit AW2 now consists of a series arrangement of the switching elements M6 and M7 which is located between the interconnected nodes K1, K2 of the circuit components SC1 and SC2 and the output D1. In the same way as the analysis circuit AW1 in FIG. 3, the analysis circuit AW2 likewise contains a series arrangement consisting of the switching elements M9 and M8 which are located between the fixed potentials VDD and VSS and where the connection point of the switching elements M8 and M9 forms the output D1.

The analysis circuit SW2 switches ZS1 and ZS2 through to the output D1 when the NAND-function and NOR-function are not fulfilled. In this case the switching elements M6 and M7 are rendered conductive. If, on the other hand, only one of the NAND-function or the NOR-function is not fulfilled, one of the switching elements M6 and M7 is blocked and, in accordance with FIG. 3, the intermediate signal ZS3 or the intermediate signal ZS4 is switched through in inverted form to the output D1.

The circuit shown in FIG. 4 operates at a higher speed than the circuit shown in FIG. 3 since the transistors M6 and M7 no longer impose a capacitive load upon the circuit components SC1 and SC2.

Figure 5:
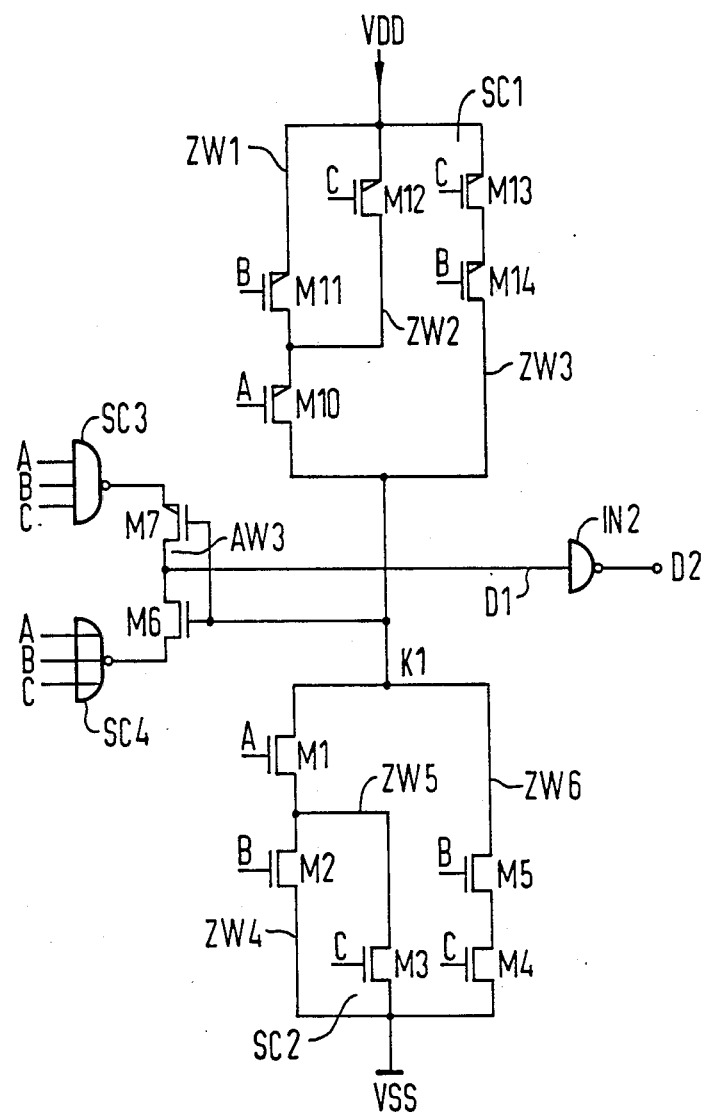
FIG. 5 represents a third exemplary embodiment of a modulo-2-adder for three input signals.

The modulo-2-adder represented in FIG. 5 results in an additional simplification of the analysis circuit AW, which has been referenced AW3. The analysis circuit now consists simply of the switching elements M6 and M7, where the switching element M6 represents a n-channel transistor and the switching element M7 represents a p-channel transistor. The control inputs of the transistors M6 and M7 are connected to one another and lead to the connection point of the nodes K1 and K2 of the circuit components SC1 and SC2. In dependence upon the potential which itself depends upon the intermediate signals ZS1 and ZS2 of the circuit components SC1 and SC2, either the transistor M6 or the transistor M7 is rendered conductive. Accordingly either the potential at the output of the NOR-gate SC4 or that at the output of the NAND-gate SC3 is applied to the output D1. If more than one input signal has the value binary "1", the binary node K1 has the value binary "0", whereas if more than one input signal has the binary value "0" the node has the value of binary "1". Thus when more than one binary "1" occurs, the transistor M7 is conductive whereas the transistor M6 is non-conductive. As a result the output of the NAND-gate SC3 is switched through to the output D1. This output has a value of binary "0" when three input signals have the value binary "1" whereas it has the value of binary "1" when less than three input signals have the value of binary "1".

If, on the other hand, more than one binary "0" occurs at the input, node K1 has the value binary "1" so that the transistor M6 is conductive and the transistor M7 is blocked. As a result the output potential ZS4 of the NOR-gate SC4 is fed to the output D1. Thus if three input signals have the value binary "0", the output signal ZS4 has the value binary "1", otherwise the value binary "0". These binary values are switched through to the output D1 via the transistor M6. An inverter IN2 is again arranged at the output D1 for decoupling purposes. The circuit in FIG. 5 can be considered to represent a non-inverting binary adder which has three inputs. As a result of the new design of AW3, a lower capacitive load is imposed upon the output which results in the fact that the circuit shown in FIG. 5 operates at a higher speed than the modulo-2-adders shown in FIG. 3 and FIG. 4. For example, the adder represented in FIG. 5 requires 2.3 ns in order to logic-link three input signals, the modulo-2-adder in FIG. 4 requires 2.77 ns and the adder in FIG. 3 requires 2.94 ns.

Figure 6:
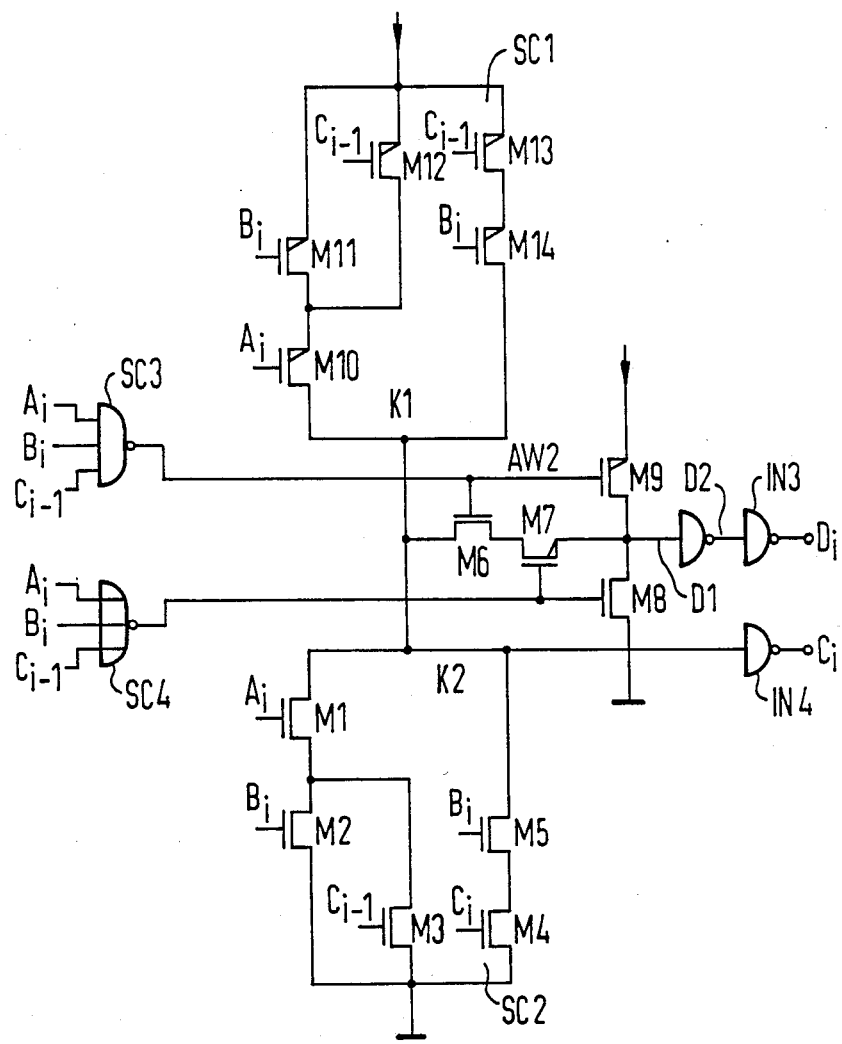
FIG. 6 represents a full-adder using the modulo-2-adder shown in FIG. 4.
Figure 7:
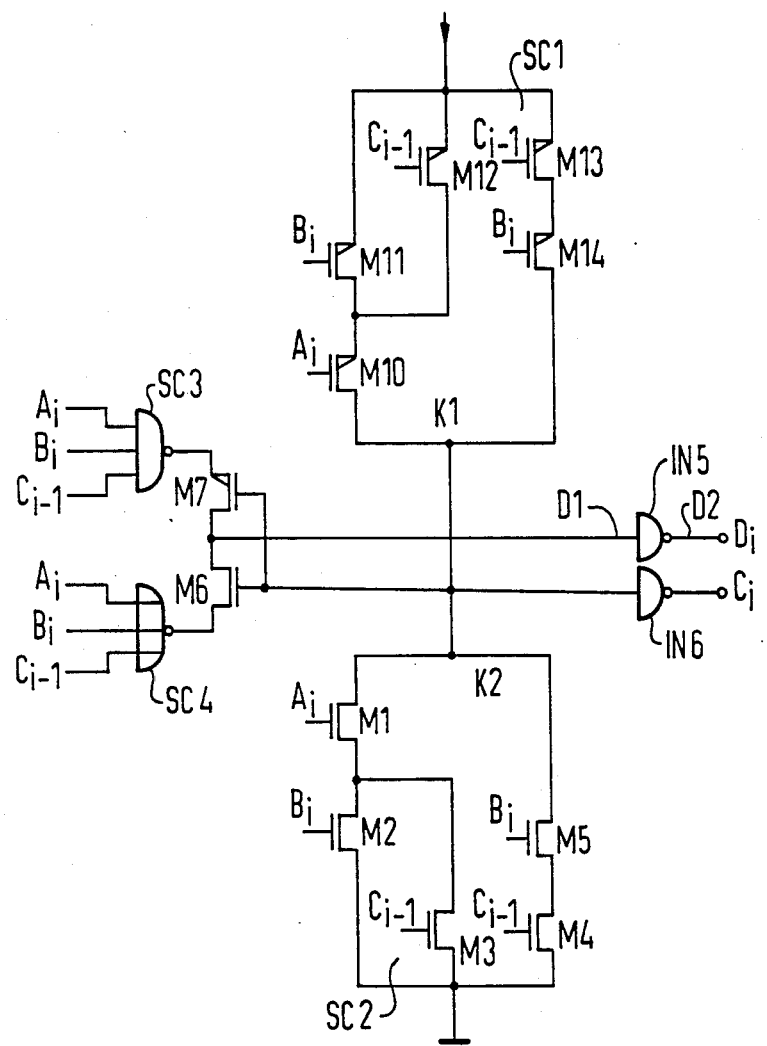
FIG. 7 represents a full-adder using the modulo-2-adder shown in FIG. 5.

FIGS. 6 and 7 represent full-adders, where the full-adder in FIG. 6 is based on the modulo-2-adder in FIG. 4 and the full-adder in FIG. 7 is based on the modulo-2-adder in FIG. 5.

The function of a binary full-adder will be described by:

$$D(i) = A(i) \oplus B(i) \oplus C(i-1)$$

$$C(i) = A(i)B(i) + A(i)C(i-1) + B(i)C(i-1)$$

where D(i) is the binary sum of the three input signals A(i) and B(i) and the carry C(i−1), and C(i) is the carry to the next adder. D(i) is thus the output value of one of the above-described binary adders which have three inputs, and C(i) is formed in the circuits as an intermediate value.

Here the full-adder represented in FIG. 6 corresponds to the modulo-2-adder shown in FIG. 4. In addition a further inverter element IN3 is connected to the output D2 in order to obtain the correct logic level at the output D(i). The carry for the next stage can be tapped from the node K2 which is connected to the node K1 and, on account of the correct logic level, fed via an inverter element IN4 to the output C(i).

The full-adder represented in FIG. 7 is based on the modulo-2-adder shown in FIG. 5. The binary sum can be directly tapped from the output D2, and the carry for the next adder stage is again tapped from the connection point of the nodes K2 and K2 and fed via an inverter element IN6 to the output Ci.

A simulation of the full-adder represented in FIG. 4 has indicated that 3.27 ns are required to obtain the binary sum and 1.62 ns are required to form the carry, whereas for the full-adder shown in FIG. 7, 2.30 ns are required to form the binary sum and 1.62 ns are required to form the carry.

What is claimed is:

1. A modulo-2-adder for the logic linking of three input signals (A,B,C), comprising, in combination:
   a first circuit component (SC1) having three circuit arms (ZW1, ZW2, ZW3) connected to receive said three input signals, each arm comprising two switching elements (M10, M11; M10, M12; M13, M14) which are arranged between a first fixed potential (VDD) and a first node (K1) and which apply an intermediate signal (ZS1), corresponding to the first binary value ("1"), to the first node when two input signals each assume the other binary value ("0");
   first connecting means for connecting said input signals (A,B,C) individually to the switching elements of said first circuit component (SC1);
   a second circuit component (SC2) have three circuit arms (ZW4, ZW5, ZW6) connected to receive said three input signals, each arm comprising two series-connected switching elements (M1, M2; M1, M3; M4, M5) which are arranged between a second fixed potential (VSS) and a second node (K2) and which apply an intermediate signal (ZS2), corresponding to the other binary value, to the second node when two input signals each assume the first binary value;
   second connecting means for connecting said input signals (A,B,C) individually to the switching elements of said second circuit component (SC2);
   a third circuit component (SC3) having three inputs for said three input signals for emitting a third intermediate signal (ZS3), corresponding to the other binary value, when all said input signals (A,B,C) assume the first binary value;
   a fourth circuit component (SC4) having three inputs for said three input signals and which generates a fourth intermediate signal (ZS4), corresponding to the first binary value, when all said input signals assume the second binary value; and
   an analysis circuit (AW) connected to said first, second, third and fourth circuit components, operative to switch through the first or second intermediate signals (ZS1, ZS2) to the output when the third intermediate signal (ZS3) assumes the first binary value and the fourth intermediate signal (jZS4) assumes the other binary value, but which otherwise switches through the third or fourth intermediate signal in inverted form to the output.

2. A modulo-2-adder as claimed in claim 1, wherein the switching elements of two of said arms (ZW) of the first and second circuit components (SC1, SC2), which are supplied with the same input signal (A), are replaced by a common switching element.

3. A modulo-2-adder as claimed in claim 1, wherein the switching elements of said first circuit component (SC1) are p-channel transistors.

4. A modulo-2-adder as claimed in claim 1, wherein the switching elements of said second circuit component (SC2) are n-channel transistors.

5. A modulo-2-adder as claimed in claim 1, wherein said third circuit component (SC3) is a NAND-gate.

6. A modulo-2-adder as claimed in claim 1, wherein said fourth circuit component (SC4) is a NOR-gate.

7. a modulo-2-adder as claimed in one of the preceding claims, wherein said analysis circuit (AW2) comprises:
   a first series arrangement connected to the first and second nodes (K1, K29 and to the output (D1) including a switching element (M6) controlled by the third circuit component (SC3) and a switching element (M7) controlled by the fourth circuit component (SC4); and
   a second series arrangement including two switching elements (M9, M8), one of which (M9) is connected to the first fixed potential (VDD), and to the output of said third circuit component (SC3), and the other switching element (M8), is connected to the second fixed potential (VSS) and to the output of said fourth circuit component (SC4), and means for connecting said two switching elements to the output (D1).

8. A modulo-2-adder as claimed in claim 7, wherein the switching element (M6) of said first series arrangement which is controlled by said third circuit component and the switching element (M8) of said second series arrangement which is controlled by said fourth circuit component are n-channel transistors and the other switching element of said first and second series arrangements are p-channel transistors.

9. A binary full-adder, employing the modulo-2-adder claimed in claim 7, including means for connecting, as said three input signals, two addends and the carry of a previous stage, whereby the sum of said input signals is emitted from said output, and means for connecting the connection point of the first and second nodes (K1, K2) to an inverter element (IN4) for manifesting the carry for the next adder stage.

10. A modulo-2-adder as claimed in one of the claims 1 to 6, wherein said analysis circuit (AW1) comprises:
  a third series arrangement connected between the first and second nodes (k1, K2), said third series arrangement having two switching elements (M6, M7), one of which (M7) is connected to the first node (K1) and controlled by said fourth circuit component (SC4), the other switching element (M6) being connected to the second node (K2) and controlled by the third circuit component (SC3), and means for connecting the connection point between said two switching elements to the output (D1); and
  a fourth series arrangement connected between the first and second fixed potentials (VDD, VSS), said fourth series arrangement having two switching elements (M9, M8), one of which (M9) is connected to the first fixed potential (VDD), and controlled by the third circuit component (SC3), and the other switching element (M8) being connected to the second fixed potential (VSS), and controlled by the fourth circuit component (SC4), and means for connecting the connection point between said two switching elements to the output (D1).

11. A modulo-2-adder as claimed in claim 10 wherein the switching element of said third series arrangement controlled by said third circuit component and the switching element of said fourth series arrangement controlled by said fourth circuit component are n-channel transistors and the other two switching elements of said third and fourth series arrangements are p-channel transistors.

12. A modulo-2-adder as claimed in one of the claims 1 to 6, wherein said analysis circuit (AW3) comprises a fifth series arrangement connected between said third and fourth circuit components (SC3, SC4) said fifth series arrangement including two switching elements (M6, M7) connected together at an interconnection point which forms the output (D1), means for connecting the control inputs of said two switching elements to the interconnected first and second nodes (K1, K2), means for connecting said first switching element (M7) to the output of said third circuit component (SC3) and means for connecting said second switching element (M6) to the output of said fourth circuit component (SC4).

13. A modulo-2-adder as claimed in claim 12, wherein the switching element of the fifth series arrangement which is controlled by said third circuit component (SC3) represents a p-channel transistor (M7) whereas the switching element of the fifth series arrangement which is controlled by said fourth circuit component (SC4) represents a n-channel transistor.

14. A binary full-adder employing the modulo-2-adder claimed in claim 12, including means for connecting, as said three input signals, two addends and the carry of a previous stage, means for connecting the interconnection point of the fifth series arrangement (M7, M6) to an inverter element (IN5) for manifesting the sum of said three input signals, and means for connecting the interconnection point of the first and second nodes (K1, K2) to a further inverter element (IN6) for manifesting the carry for the next adder stage.

15. A modulo-2-adder as claimed in any of claims 1 to 6, including an inverter element (IN1, IN2) connected to the output (D1).

16. Apparatus according to claim 1, in which said first connecting means connects said input signals in three different pairs to the two switching elements of each arm of said first circuit component, and said second connecting means connects said three input signals in three different pairs to the two switching elements of each arm of the second circuit component.

* * * * *